(12) United States Patent
Clevenger et al.

(10) Patent No.: US 10,014,255 B2
(45) Date of Patent: Jul. 3, 2018

(54) CONTACTS HAVING A GEOMETRY TO REDUCE RESISTANCE

(71) Applicant: INTERNATIONAL BUSINESS MACHINES CORPORATION, Armonk, NY (US)

(72) Inventors: Lawrence A. Clevenger, LaGrangeville, NY (US); Baozhen Li, South Burlington, VT (US); Kirk D. Peterson, Jericho, VT (US); Terry A. Spooner, Clifton Park, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/069,439

(22) Filed: Mar. 14, 2016

(65) Prior Publication Data

US 2017/0263557 A1 Sep. 14, 2017

(51) Int. Cl.
| | | |
|---|---|---|
| *H01L 23/528* | (2006.01) | |
| *H01L 21/768* | (2006.01) | |
| *H01L 23/532* | (2006.01) | |
| *H01L 23/535* | (2006.01) | |

(52) U.S. Cl.
CPC .... *H01L 23/5283* (2013.01); *H01L 21/76805* (2013.01); *H01L 21/76816* (2013.01); *H01L 21/76843* (2013.01); *H01L 21/76895* (2013.01); *H01L 23/535* (2013.01); *H01L 23/53266* (2013.01)

(58) Field of Classification Search
CPC .... H01L 21/76801–21/76814; H01L 45/1683; H01L 2221/10–2221/1089; H01L 2224/05006–2224/05093; H01L 2224/05546; H01L 21/02063; H01L 21/486; H01L 21/76877–21/76879; H01L 21/76897; H01L 23/481–23/4855; H01L 23/5226
See application file for complete search history.

(56) References Cited

U.S. PATENT DOCUMENTS

| | | | |
|---|---|---|---|
| 4,517,225 | A | 5/1985 | Broadbent |
| 4,853,347 | A | 8/1989 | Bukhman et al. |
| 7,264,846 | B2 | 9/2007 | Chang et al. |
| 8,643,122 | B2 | 2/2014 | Klptekin et al. |
| 8,878,311 | B2 | 11/2014 | Cheng et al. |

(Continued)

OTHER PUBLICATIONS

IBM, "Trench Silicide Contacts" IP.com, IPCOM000184829D, Jul. 1, 2009, pp. 1-2.

*Primary Examiner* — Cuong B Nguyen
(74) *Attorney, Agent, or Firm* — Tutunjian & Bitetto, P.C.; Vazken Alexanian (57) ABSTRACT

A method of increasing the surface area of a contact to an electrical device that in one embodiment includes forming a contact stud extending through an intralevel dielectric layer to a component of the electrical device, and selectively forming a contact region on the contact stud. The selectively formed contact region has an exterior surface defined by a curvature and has a surface area that is greater than a surface area of the contact stud. An interlevel dieletric layer is formed on the intralevel dielectric layer, wherein an interlevel contact extends through the interlevel dielectric layer into direct contact with the selectively formed contact region.

4 Claims, 3 Drawing Sheets

(56) References Cited

U.S. PATENT DOCUMENTS

| | | |
|---|---|---|
| 8,927,378 B2 | 1/2015 | Pei et al. |
| 2004/0149992 A1* | 8/2004 | Park .................. H01L 21/76831 |
| | | 257/71 |
| 2005/0023589 A1* | 2/2005 | Yamada ............ H01L 27/10855 |
| | | 257/310 |
| 2005/0220998 A1 | 10/2005 | Chang et al. |
| 2005/0236687 A1* | 10/2005 | Chan ................... H01L 21/2022 |
| | | 257/482 |
| 2008/0079090 A1 | 4/2008 | Hwang et al. |
| 2008/0149993 A1* | 6/2008 | Kajimoto .............. H01L 27/115 |
| | | 257/316 |
| 2009/0269507 A1 | 10/2009 | Yu et al. |
| 2013/0187171 A1 | 7/2013 | Guillom et al. |
| 2015/0170961 A1 | 6/2015 | Romero et al. |

* cited by examiner

FIG. 6

CONTACTS HAVING A GEOMETRY TO REDUCE RESISTANCE

BACKGROUND

Technical Field

The present disclosure relates to interconnect devices and structures for transmitting electrical current.

Description of the Related Art

Modem integrated circuits are made up of literally millions of active devices such as transistors and capacitors. These devices are initially isolated from one another but are later interconnected together to formed functional circuits. The quality of the interconnection structure drastically affects the performance and reliability of the fabricated circuit. Interconnections are increasingly determining the limits of performance and density of modern ultra large scale integrated (ULSI) circuits.

SUMMARY

In one embodiment, a contact to a semiconductor device. In some embodiments, the electrical contact may include a first contact portion extending through an intralevel dielectric to a semiconductor device. The upper surface of the first contact portion that is opposing the surface of the first contact portion that is in contact with the semiconductor device has a planar upper surface. A second contact portion has an exterior surface defined by a curvature and a width greater than the first contact portion The curvature of the second contact portion has a greater surface area than the planar upper surface of the first contact portion. A third contact portion is in direct contact with the second contact portion and encapsulates the second contact portion.

In another embodiment of the present disclosure, a method of increasing the surface area of a contact to an electrical device is provided that includes forming a contact stud extending through the intralevel dielectric layer. A selectively formed contact region is formed on an upper surface of the contact stud that is coplanar with an upper surface of the intralevel dielectric layer, wherein the selectively formed contact region has an exterior surface defined by a curvature and has a surface area that is greater than a surface area of the contact stud having said exposed sidewall surfaces. An interlevel dielectric layer is formed on the intralevel dielectric layer, wherein an interlevel contact extends through the interlevel dielectric layer into direct contact with the selectively formed contact region.

In another embodiment of the present disclosure, a method of increasing the surface area of a contact to an electrical device is provided that includes recessing an intralevel dielectric layer to expose sidewall surfaces of a contact stud that is extending through the intralevel dielectric layer. A selectively formed contact region is formed on a portion of the contact stud exposed by recessing said intralevel dielectric layer, wherein the selectively formed contact region has an exterior surface defined by a curvature and has a surface area that is greater than a surface area of the contact stud having said exposed sidewall surfaces. An interlevel dielectric layer is formed on the intralevel dielectric layer, wherein an interlevel contact extends through the interlevel dielectric layer into direct contact with the selectively formed contact region.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

With increasing scaling for next generation complementary metal oxide semiconductor (CMOS) devices, the middle of the line (MOL) resistance can affect device performance. It has been determined that in order to over-come the MOL high resistance issues, that in some embodiments, the high-resistance interface between the contact to the source and drain regions (CA) contact, and the trench silicide (TS) contact can play a critical role. In conventional processing, a liner is needed for source and drain region contact metallization, which is typically composed of a metal nitride, such as titanium nitride. It has been determined that in some instances, the metal nitride liner has a high resistivity. It has been determined that in some instances, the high resistivity metal nitride liner in combination with the small area of the interface between the source and drain region contacts and the trench silicide (TS) contact makes the resistance of the contact unacceptably high.

In some embodiments, the methods and structures that are disclosed herein provide a novel method to form a lower-resistance contact between the contacts to the source and drain regions (CA contacts) and the trench silicide contact (TS contact) by remove the portion of the high resistivity metal nitride liner that is present at the interface, and replacing the high resistivity metal nitride liner with a selective metal growth that has lower resistance. Some embodiments of the methods and structures disclosed herein, are now described in more detail with reference to FIGS. 1-6.

Figure 1:
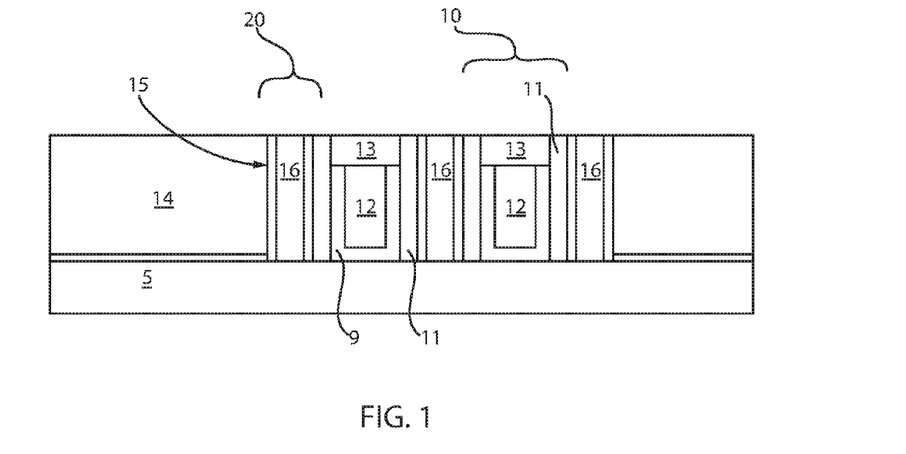
FIG. 1 is a side cross-sectional view depicting an electrical device including a portion of an interconnect structure, in accordance with one embodiment of the present disclosure.

FIG. 1 depicts one embodiment of a first portion 20 of a contact (also referred to as interconnect) to an electrical device 100. In the embodiment depicted in FIG. 1, the electrical device 100 includes a fin structure 5. The fin structure 5 may be a portion of a Fin type Field Effect Transistor (FinFET). A "field effect transistor (FET)" is a semiconductor device in which the output current, i.e., source-drain current, is controlled by the voltage applied to the gate. A FET has three terminals, i.e., gate structure, source region and drain region. A FinFET includes a fin structure. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. Although the semiconductor devices that are depicted in figures of the present disclosure are field effect transistors (FET), it is noted that any semiconductor device is suitable for use with the methods and structures of the present disclosure. The electrical device 100 that is depicted in FIG. 1 may be employed in any electrical device. For example, the interconnect structures that are disclosed herein may be present within electrical devices that employ semiconductors that are present within integrated circuit chips. The integrated circuit chips including the disclosed interconnects may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

The first portion 20 of the contact, as well as the subsequently described second and third portions 25, 30, together provide an interconnect to the electrical device 100. The term "interconnect" denotes a conductive structure that transmits an electrical signal, e.g., electrical current, from one portion of a device to at least a second portion of the device. The interconnect may provide for electrical communication in a vertical direction, i.e., along a plane extending from the top to bottom, of a device including stacked material layers providing a plurality of levels within a device. In this manner, the interconnect may be present in a via. The interconnect may also provide for electrical communication in a horizontal direction, i.e., along a plane that is planar to an upper surface of the fin structure 5. In this manner, the interconnect may be a metal line and/or wiring.

Referring to FIG. 1, the first portion 20 of the interconnect structure may be composed of a metal. In one embodiment, the copper including material is a pure copper, i.e., 100 at. % copper. For example, the first portion 20 of the interconnect structure may be composed of tungsten (W), cobalt (Co), ruthenium (Ru), titanium (Ti), aluminum (Al), copper (Cu) and combinations thereof. It is noted that any composition may be employed for the first portion 20 of the interconnect structure, so long as the composition is electrically conductive. "Electrically conductive" as used through the present disclosure means a material typically having a room temperature conductivity of greater than $10^{-8}(\Omega\text{-m})^{-1}$.

Referring to FIG. 1, the first portion 20 of the interconnect structure may be in direct contact with the source and drain region portions of the fin structure 5. In some embodiments, the first portion 20 of the interconnect structure may be in direct contact with a silicide that is formed on the source region and drain region portions of the fin structures 5, and may be referred to as a trench silicide contact (TS) contact portion of the interconnect. The first portion 20 of the interconnect structure may also be referred to a metal stud portion of the interconnect structure.

The first portion 20 of the interconnect structure may be formed after the gate structure 10 has been formed to the fin structure 10. The gate structure 10 is formed on the channel portion of the fin structure 5, in which the source region portion and the drain region portions of the fin structure 5 are on opposing sides of the channel region portion. In the embodiment that is depicted in FIG. 1, the gate structure 10 may include a gate dielectric 9, and a gate conductor 12. The gate structure 10 may be formed using gate first or gate last, i.e., replacement gate processing. In one embodiment, the gate dielectric 9 may be composed of silicon oxide, or a high-k dielectric material, such as hafnium oxide ($HfO_2$). The gate conductor 12 may be composed of a conductive material, such as a doped semiconductor, e.g., n-type doped polysilicon, or a metal, such as tungsten (W) or an n-type or p-type work function metal, e.g., titanium nitride.

A gate cap 13 may be present atop the gate structure 10. The gate cap 13 may be composed of any dielectric material, such as an oxide, nitride or oxynitride material. For example, when the dielectric material that provides the gate cap 13 is a nitride, the gate cap 13 may be composed of silicon nitride. The gate cap 13 may be deposited using a method, such as chemical vapor deposition (CVD), e.g., plasma enhanced chemical vapor deposition. The gate cap 13 may also be patterned using photolithography and etch processes.

Gate sidewall spacers 11 may be formed on the sidewalls of the gate structure 10. In one embodiment, the gate sidewall spacers 11 may be composed of a low-k dielectric material. The term "low-k" as used to describe the low-k dielectric material 30 denotes a material having a dielectric constant that is less than silicon dioxide at room temperature (e.g., 25° C.). In one embodiment, the low-k dielectric material 30 has a dielectric constant that is less than 4.0, e.g., 3.9. In some embodiments, examples of low-k dielectric materials that are suitable for the gate sidewall spacers 11 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. The gate sidewall spacers 11 may be formed using a deposition process, such as chemical vapor deposition or spin on deposition, followed by an etch back process, such as reactive ion etch (RIE).

Following formation of the gate sidewall spacers, the source and drain portions of the fin structure 5 may be processed to provide source and drain regions. This can include ion implantation of n-type or p-type dopants into the source and drain region portions of the fin structure 5 and/or epitaxial growth of n-type or p-type semiconductor material on the source and drain region portions of the fin structure 5.

In a following process step, an intralevel dielectric material 14 may be formed atop the gate structure 10 and the fin structure 15. The intralevel dielectric material 14 may be selected from the group consisting of silicon containing materials, such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H). Additional choices for the intralevel dielectric layer 14 include any of the aforementioned materials in porous form, or in a form that changes during processing to or from being porous and/or permeable to being non-porous and/or non-permeable. The intralevel dielectric layer 14 may be deposited using chemical vapor deposition (CVD) or spin on deposition. Following deposition, the upper surface of the intralevel dielectric layer 14 may be planarized, using a planarization process, such as chemical mechanical planarization (CMP).

Still referring to FIG. 1, via openings may then be formed through the intralevel dielectric 14 to expose the portions of the source and drain region portions of the fin structure 5. The via openings may be formed using photolithography and etch processes. Specifically, and in one example, a etch mask pattern is produced by applying a photoresist to the surface to be etched, exposing the photoresist to a pattern of radiation, and then developing the pattern into the photoresist utilizing a resist developer. Once the patterning of the photoresist is completed, the sections of the intralevel dielectric layer 14 covered by the photoresist are protected, while the exposed regions are removed using a selective etching process that removes the unprotected regions to form the via openings. The etch process may be reactive ion etch, which can be selective to the gate sidewall spacers 12.

In some embodiments, a metal nitride layer 15 is formed on the sidewalls of the via openings. The metal nitride layer 15 may be composed of titanium nitride (TiN), tantalum nitride (TaN), tungsten nitride, aluminum nitride and combinations thereof. The metal nitride layer 15 may be deposited using chemical vapor deposition (CVD) or physical vapor deposition (PVD) methods. For example, the metal nitride layer 15 may be formed using atomic layer deposition (ALD). Examples of CVD suitable for forming the metal nitride layer 15 include plasma enhanced CVD. Examples of PVD suitable for forming the metal nitride layer 15 include plating or sputtering. The thickness of the metal nitride layer 15 may range from 1 nm to 10 nm. In some examples, the thickness of the metal nitride layer 15 may range from 1 nm to 5 nm.

Following formation of the metal nitride layer 15, the via openings may be filled with the first contact portion 20 of the interconnect. The first contact portion 20 is typically composed of an electrically conductive material. For example, the first contact portion 20 may be composed of a metal that is selected from tungsten (W), cobalt (Co), ruthenium (Ru), titanium (Ti), aluminum (Al), copper (Cu) and combinations thereof. In other examples, the first contact portion 20 may be composed of a doped semiconductor, such as n-type polysilicon. The electrically conductive material for the first contact portion 20 may be deposited using chemical vapor deposition (CVD) or physical vapor deposition (PVD). Examples of CVD suitable for forming the first contact portion include metal organic chemical vapor deposition (MOCVD), plasma enhanced chemical vapor deposition (PECVD), and high density plasma (HDPCVD). Examples of PVD suitable for forming the first contact portion 20 of the interconnect including plating, electroplating, electroless plating, sputtering and combinations thereof.

The upper surface of the first contact portion 20 may be planarized to be coplanar with the upper surface of the intralevel dielectric layer 14. In some embodiments, the upper surface of the first contact portion 20 is coplanar with the upper surface of the intralevel dielectric layer 14 and the upper surface of the metal nitride layer 15. The planarization process may be provided by chemical mechanical planarization, grinding or polishing. As noted above, the first contact portion 20 may be referred to as a stud, which can have sidewalls with a length substantially perpendicular to an upper surface of source and drain portions of the semiconductor device, i.e., fin structure 5.

Figure 2:
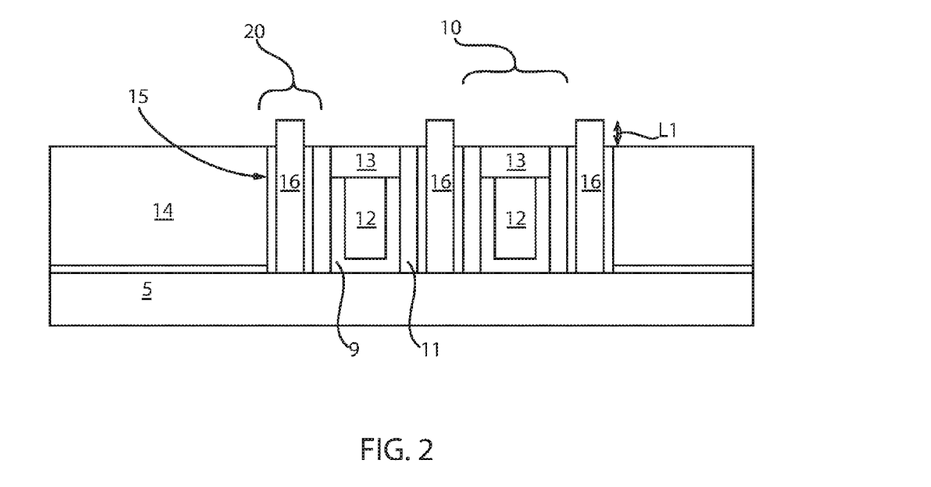
FIG. 2 is a side cross-sectional view of recessing an intralevel dielectric layer of the electrical device to expose a liner material that is present on the sidewall surfaces of a contact stud that is extending through the intralevel dielectric layer, in accordance with one embodiment of the present disclosure.

FIG. 2 depicts one embodiment of recessing an intralevel dielectric layer 14 of the electrical device 100 to expose the metal nitride layer 15 that is present on the sidewall surfaces of a contact stud, i.e., first contact portion 20, that is extending through the intralevel dielectric layer 14 to the electrical device, i.e., fin structure 5, e.g., source and drain region portion of the fin structure 5. The interlevel dielectric layer 14 may be recessed by a selective etch. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater.

In some embodiments, the interlevel dielectric layer 14 may be recessed by an etch process that is selective to the metal nitride layer 15 and the first contact portion 20. In some embodiments, the intralevel dielectric layer 14 may be recessed using a wet or dry etch process. For example, the etch process may be a selective wet chemical etch. In other examples, the etch process for recessing intralevel dielectric 14 is a dry etch process, such as gas plasma etching or reactive ion etching (RIE).

In some embodiments, the etch process may continue until the upper ⅛ portion of the metal nitride layer and first contact portion 20 are exposed. In some other embodiments, the etch process may continue until the upper ⅕ portion of the metal nitride layer and first contact portion 20 are exposed. In yet other embodiments, the etch process may continue until the upper ¼ portion of the metal nitride layer and first contact portion 20 are exposed. The length L1 of the portion of the metal nitride layer 15 and the first contact portion 20 that are exposed by recess step may range from 2 nm to 50 nm. In another embodiment, the length L1 of the portion of the metal nitride layer 15 and the first contact portion 20 that are exposed by recess step may range from 2 nm to 10 nm.

Figure 3:
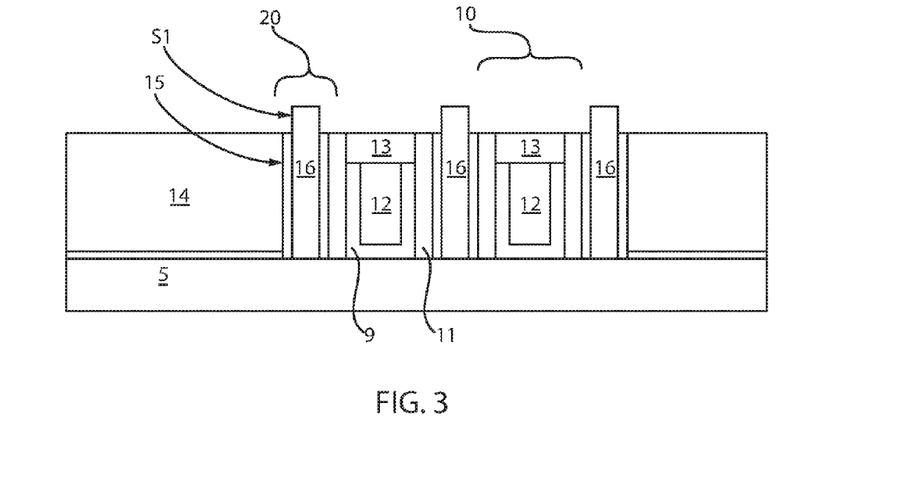
FIG. 3 is a side cross-sectional view depicting selectively removing the liner material exposed by recessing the intralevel dielectric layer, in accordance with one embodiment of the present disclosure.

FIG. 3 depicts one embodiment of selectively removing the metal liner 15 material exposed by recessing the intralevel dielectric layer 14. The portion of the metal liner 15 that is covered by the intralevel dielectric layer 14 is protected, and remains following etching. The exposed portion of the metal liner 15 is removed by an etch process that is selective to the first contact portion 20. In some embodiments, the exposed portion of the metal liner 15 is removed using a wet or dry etch process. For example, the etch process may be a selective wet chemical etch. In other examples, the etch process for removing the metal liner 15 is a dry etch process, such as gas plasma etching or reactive ion etching (RIE).

Figure 4:
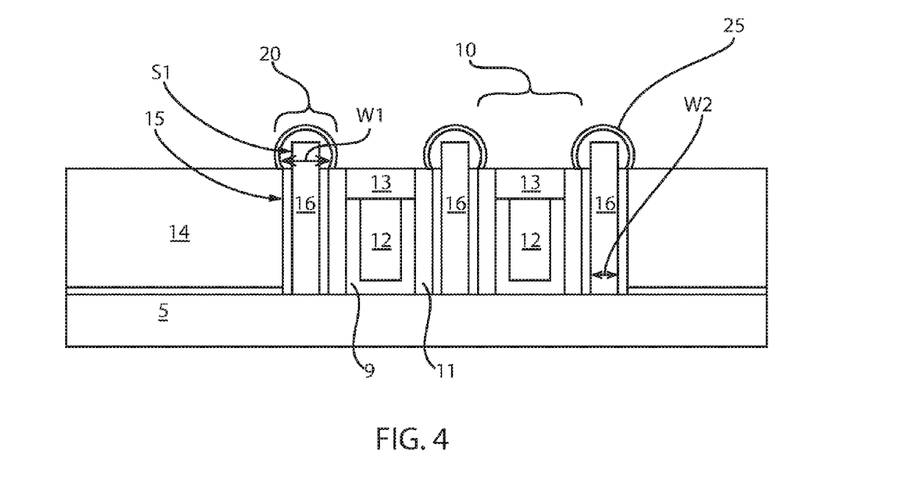
FIG. 4 is a side cross-sectional view depicting selectively forming a contact region on a portion of the contact stud exposed by recessing the intralevel dielectric layer, wherein the selectively formed contact region has an exterior surface defined by a curvature and has a surface area that is greater than a surface area of the contact stud having said exposed sidewall surfaces, in accordance with one embodiment of the present disclosure.

FIG. 4 depicting selectively forming a contact region (also referred to as second contact portion 25) on a portion of the contact stud (also referred to as first contact portion 20) that is exposed by recessing the intralevel dielectric layer 14. The second contact portion 25 is composed of an electrically conductive material, which in some examples is provided by a metal. The term "selective forming", "selectively forming" or "selectively formed" denotes that the electrically conductive materials forms on the metallic surfaces of the first contact portion 20, but does not form on dielectric surfaces, such as the intralevel dielectric 14.

In one embodiment, the second contact portion 25 may be provided by a cobalt (Co) deposited material, which is selectively formed on a first contact portion 20, such as a first contact portion 20 that is composed of copper (Cu). The cobalt second contact portion 25 may be selectively deposited or formed on copper surfaces of a first contact portion 10 while leaving bare the exposed surfaces of intralevel dielectric 14 across the substrate field.

The selective deposition process for the cobalt second contact portion 25 may include positioning the structure depicted in FIG. 3 in the process chamber of a CVD type deposition apparatus; exposing the structure depicted in FIG. 3 to a deposition gas to form a cobalt material layer, optionally purging the deposition chamber, exposing the substrate to a plasma treatment process, purging the deposition chamber, and determining if a predetermined thickness of the selectively formed cobalt layer that provides the second contact portion has been formed on the exposed surface of the first contact portion 20. In some embodiments, the above described deposition cycle may be repeated if the cobalt material layer for the second contact portion 25 has not been formed having the desired thickness and coverage.

In some embodiments, the second contact portion 25 has an exterior surface defined by a curvature and has a surface area that is greater than a surface area of the contact stud, i.e., first contact portion 20, having the exposed sidewall surfaces by removing the portion of the metal nitride layer 15 that extends above the recessed surface of the intralevel dielectric 14. The thickness of the selectively formed material for the second contact portion 25 may range from 1 nm to 20 nm. In another embodiment, the thickness of the second contact portion ranges from 1 nm to 10 nm.

In one embodiment, a method for selective forming the second contact portion 25 of cobalt includes exposing the structure including the first contact portion 20 to a cobalt precursor gas and hydrogen gas to selectively form a cobalt material layer over the metallic copper containing surface of the first contact portion 20 while leaving exposed the dielectric surface, i.e., intralevel dielectric surface, during a vapor deposition process, and exposing the deposited cobalt layer to a plasma and a reagent, such as nitrogen, ammonia, hydrogen, an ammonia/nitrogen mixture, or combinations thereof during a post-treatment process.

In another embodiment, a method for capping a copper surface on a substrate provided which includes depositing a cobalt material layer over the exposed copper containing surfaces of the first contact portion 20 while leaving exposed the dielectric surface during a deposition-treatment cycle. In a pie, the deposition-treatment cycle includes exposing the structure including the first contact portion 20 to a cobalt precursor gas to selectively form a first cobalt layer for the second contact portion 25 over the metallic copper surface of the first contact portion 20, while leaving exposed the dielectric surface during a vapor deposition process, exposing the first cobalt layer to a plasma containing nitrogen, ammonia, an ammonia/nitrogen mixture, or hydrogen during a treatment process. The method further provides exposing the substrate to the cobalt precursor gas to selectively form a second cobalt layer over the first cobalt layer while leaving exposed the dielectric surface during the vapor deposition process, a)sing the second cobalt layer to the plasma during the treatment process.

In some examples, the method provides exposing the substrate to the cobalt precursor gas to selectively form a third cobalt layer over the second cobalt layer while leaving exposed the dielectric surface during the vapor deposition process, and exposing the third cobalt layer to the plasma during the treatment process.

Suitable cobalt precursors for forming cobalt-containing materials (e.g., metallic cobalt or cobalt alloys) by chemical vapor deposition (CVD) or atomic layer deposition (ALD) processes described herein include cobalt carbonyl complexes, cobalt amidinates compounds, cobaltocene compounds, cobalt dienyl complexes, cobalt nitrosyl complexes, derivatives thereof, complexes thereof, plasma thereof, or combinations thereof. In some embodiments, cobalt materials may be deposited by CVD and ALD processes further described in commonly assigned U.S. Pat. No. 7,264,846 and U.S. Ser. No. 10/443,648, filed May 22, 2003, and published as US 2005-0220998, which are herein incorporated by reference.

In some embodiments, cobalt carbonyl compounds or complexes may be utilized as cobalt precursors. Cobalt carbonyl compounds or complexes have the general chemical formula $(CO)_xCo_yL_z$, where X may be 1, 2, 3, 4, 5, 6, 7, 8, 9, 10, 11, or 12, Y may be 1, 2, 3, 4, or 5, and Z may be 1, 2, 3, 4, 5, 6, 7, or 8. The group L is absent, one ligand or multiple ligands, that may be the same ligand or different ligands, and include cyclopentadienyl, alkylcyclopentadienyl (e.g., methylcyclopentadienyl or pentamethylcyclopentadienyl), pentadienyl, alkylpentadienyl, cyclobutadienyl, butadienyl, ethylene, allyl (or propylene), alkenes, dialkenes, alkynes, acetylene, bytylacetylene, nitrosyl, ammonia, derivatives thereof, complexes thereof, plasma thereof, or combinations thereof. Some exemplary cobalt carbonyl complexes include cyclopentadienyl cobalt bis(carbonyl) $(CpCo(CO)_2)$, tricarbonyl allyl cobalt $((CO)_3Co(CH_2CH=CH_2))$, dicobalt hexacarbonyl bytylacetylene (CCTBA, $(CO)_6Co_2(HC\equiv C^tBu)$), dicobalt hexacarbonyl methylbytylacetylene $((CO)_6Co_2(MeC\equiv C^tBu))$, dicobalt hexacarbonyl phenylacetylene $((CO)_6Co_2(HC\equiv CPh))$, hexacarbonyl methylphenylacetylene $((CO)_6Co_2(MeC\equiv CPh))$, dicobalt hexacarbonyl methylacetylene $((CO)_6Co_2(HC\equiv CMe))$, dicobalt hexacarbonyl dimethylacetylene ((CO)$_6$Co$_2$(MeC≡CMe)), derivatives thereof, complexes thereof, plasma thereof, or combinations thereof.

In another embodiment, cobalt amidinates or cobalt amido complexes may be utilized as cobalt precursors. Cobalt amido complexes have the general chemical formula (RR'N)$_x$Co, where X may be 1, 2, or 3, and R and R' are independently hydrogen, methyl, ethyl, propyl, butyl, alkyl, silyl, alkylsilyl, derivatives thereof, or combinations thereof. Some exemplary cobalt amido complexes include bis(di (butyldimethylsilyl)amido) cobalt (((BuMe$_2$Si)$_2$N)$_2$Co), bis (di(ethyidimethylsilyl)amido) cobalt (((EtMe$_2$Si)$_2$N)$_2$Co), bis(di(propyidimethylsilyl)amido) cobalt (((PrMe$_2$Si)$_2$N)$_2$Co), bis(di(trimethylsilyl)amido) cobalt (((Me$_3$Si)$_2$N)$_2$Co), tris(di(trimethylsilyl)amido) cobalt (((Me$_3$Si)$_2$N)$_3$Co), derivatives thereof, complexes thereof, plasma thereof, or combinations thereof.

Some exemplary cobalt precursors include methylcyclopentadienyl cobalt bis(carbonyl) (MeCpCo(CO)$_2$), ethylcyclopentadienyl cobalt bis(carbonyl) (EtCpCo(CO)$_2$), pentamethylcyclopentadienyl cobalt bis(carbonyl) (Me$_5$CpCo (CO)$_2$), dicobalt octa(carbonyl) (Co$_2$(CO)$_8$), nitrosyl cobalt tris(carbonyl) ((ON)Co(CO)$_3$), bis(cyclopentadienyl) cobalt, (cyclopentadienyl) cobalt (cyclohexadienyl), cyclopentadienyl cobalt (1,3-hexadienyl), (cyclobutadienyl) cobalt (cyclopentadienyl), bis(methylcyclopentadienyl) cobalt, (cyclopentadienyl) cobalt (5-methylcyclopentadienyl), bis(ethylene) cobalt (pentamethylcyclopentadienyl), cobalt tetracarbonyl iodide, cobalt tetracarbonyl trichlorosilane, carbonyl chloride tris(trimethylphosphine) cobalt, cobalt tricarbonyl-hydrotributylphosphine, acetylene dicobalt hexacarbonyl, acetylene dicobalt pentacarbonyl triethylphosphine, derivatives thereof, complexes thereof, plasma thereof, or combinations thereof.

Suitable reagents, including reducing agents, that are useful to form cobalt-containing materials (e.g., metallic cobalt, cobalt capping layers, or cobalt alloys) by processes described herein include hydrogen (e.g., H$_2$ or atomic-H), atomic-N, ammonia (NH$_3$), hydrazine (N$_2$H$_4$), a hydrogen and ammonia mixture (H$_2$/NH$_3$), borane (BH$_3$), diborane (B$_2$H$_6$), triethylborane (Et$_3$B), silane (SiH$_4$), disilane (Si$_2$H$_6$), trisilane (Si$_3$H$_8$), tetrasilane (Si$_4$H$_{10}$), methyl silane (SiCH$_6$), dimethylsilane (SiC$_2$H$_8$), phosphine (PH$_3$), derivatives thereof, plasmas thereof, or combinations thereof.

It is noted that the above described deposition processes may employ the depsoitino chamber of an atomic layer deposition (ALD) apparatus, or a chemical vapor deposition (CVD) apparatus. e.g., plasma enhanced chemical vapor deposition (PECVD) apparatus. Further details regarding forming a selectively formed cobalt (Co) layer for the second contact portion 25 can be found in U.S. Patent Application Publication No. 2009/0269507, which is incorporated herein by reference.

The selective deposition of metals, such as tungsten (W) and ruthenium (Ru), for the second contact portion 25 may be greatly enhanced by subjecting the deposition surface to a hydrogen species. Hydrogen has a low diffusion rate into many conducting materials, such as metals while it merely passes through many non-conducting materials such as dielectrics. In other words, exposed surfaces of the first contact portion 20 will become saturated with hydrogen while the intralevel dielectric layer 14 will not. The hydrogen may come from one or more of a number of distinct sources. For instance, the hydrogen may be supplied as H$_2$ gas or may be derived from a silane on other hydrogen containing compound gas. Additionally, many methods of providing the hydrogen species such as hydrogen plasma treatments, annealing in a hydrogen atmosphere or hydrogen ion implantation may be employed.

Depending upon the type of reactor employed and its configuration, the exposed surfaces of the first contact portion 20 may be subjected to a hydrogen species and have metal selectively deposited thereon simultaneously or by using separate processing steps. If tungsten (W) were to be deposited on first contact portion 20, a typical reaction would be:

(WF$_6$)gas+(3H$_2$)gas>(6HF)gas+(W)solid

This reaction represents the reduction of tungsten hexafluoride (WF$_6$) by hydrogen gas. Although the tungsten source of the above reaction was tungsten hexafluoride, other gases containing tungsten such as tungsten hexachloride (WCl$_6$) may be employed in its place. One skilled in the art will further understand that other metal containing gases and compounds capable of being reduced by hydrogen may be employed in conjunction with the present disclosure.

A specific example of one embodiment for forming the second contact portion 25 on the first contact portion 20 may include two processing steps in different reactors. For example, initially the structure including the first contact portion 20 that the second contact portion 25 is formed on is placed into an RIE reactor. In this embodiment the RIE reactor is an Applied Materials AME 8120. The RIE reactor is set so that the wafer temperature is in the range of 45 to 50 degrees centigrade with a preferred wafer temperature being approximately 48 degrees centigrade. The reactor pressure is set in a range of 80 to 120 millitorr with a preferred pressure of approximately 90 millitorr. The hydrogen flow is in the range of 10 to 80 SCCM with a preferred flow being approximately 50 SCCM. The RF power supplied is in the range of 1000 to 1500 watts with a preferred power of approximately 1225 watts while the reaction time is in the range of 1 to 10 minutes with a preferred time of approximately 5 minutes.

Once the exposed surface of the first contact portion 20 have been subjected to the hydrogen plasma treatment in the RIE reactor as discussed above, it is placed into a Spectrum CVD single wafer LPCVD system under the following conditions. The process temperature is set in a range of 450 to 500 degrees centigrade, and the reactor pressure is in the range of 100 to 150 millitorr, while the hydrogen gas flow is in a range of 20 to 60 SCCM. The tungsten hexafluoride flow is in the range of 2 to 6 SCCM. In some embodiments, the above conditions will result in a tungsten deposition rate for the second contact portion 25 upon the first contact portion 20 of approximately 1000 angstroms per minute with a deposition rate of substantially zero on the intralevel dielectric 14.

It is noted that the above examples of selectively forming the metal for the second contact portion 25 is provided for illustrative purposes only, and is not intended to limit the present disclosure to only these examples.

The selectively formed contact region, i.e., second contact portion 25, may have an exterior surface defined by a curvature and has a surface area that is greater than a surface area of the contact stud, i.e., first contact portion 20, having the exposed sidewall surfaces. The curvature of the second contact portion 25 is convex relative to the upper surface of the first contact portion 20. The width W2 of the second contact portion 25 may range from 5 nm to 30 nm, and the width of the first contact portion 20 may range from 5 nm to 50 nm. In another embodiment, the width W2 of the second contact portion 25 ranges from 5 nm to 25 nm, and the width of the first contact portion 20 ranges from 5 nm to 35 nm.

Figure 5:
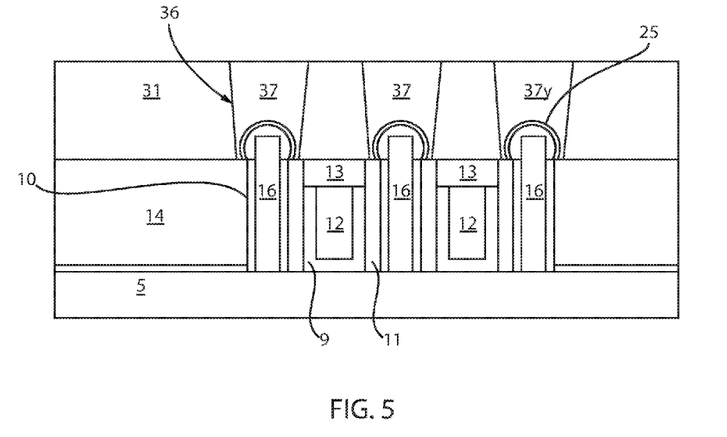
FIG. 5 is a side cross-sectional view depicting forming an interlevel dielectric layer on the intralevel dielectric layer, and forming an interlevel contact through the interlevel dielectric layer into direct contact with the selectively formed contact region, in accordance with one embodiment of the present disclosure.

FIG. 5 depicts forming an interlevel dielectric layer 31 on the intralevel dielectric layer 14, and forming an interlevel contact 37 (also referred to as third contact portion 37) through the interlevel dielectric layer 31 into direct contact with the selectively formed contact region 25, i.e., second contact portion 25. The interlevel dielectric layer 31 may be selected from the group consisting of silicon containing materials, such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H). Additional choices for the interlevel dielectric layer 31 include any of the aforementioned materials in porous form, or in a form that changes during processing to or from being porous and/or permeable to being non-porous and/or non-permeable. The interlevel dielectric layer 31 may be deposited using chemical vapor deposition (CVD) or spin on deposition. Following deposition, the upper surface of the interlevel dielectric layer 31 may be planarized, using a planarization process, such as chemical mechanical planarization (CMP).

Still referring to FIG. 5, via openings may then be formed through the interlevel dielectric layer 31 to expose the second contact portion 25 that extends above the intralevel dielectric layer 14. The via openings may be formed using photolithography and etch processes. Specifically, and in one example, a etch mask pattern is produced by applying a photoresist to the surface to be etched, exposing the photoresist to a pattern of radiation, and then developing the pattern into the photoresist utilizing a resist developer. Once the patterning of the photoresist is completed, the sections of the interlevel dielectric layer 31 covered by the photoresist are protected, while the exposed regions are removed using a selective etching process that removes the unprotected regions to form the via openings. The etch process may be reactive ion etch, which can be selective to the intralevel dielectric 14 and the second contact portion 25.

The vias through the interlevel dielectric 31 typically have a width that is greater than the width of the second contact portion 25.

In some embodiments, a metal liner 36 is formed on the sidewalls of the via openings through the interlevel dielectric 31. The metal liner 36 may be composed of titanium nitride (TiN), tantalum nitride (TaN), tungsten nitride, aluminum nitride and combinations thereof. The metal liner 36 may be deposited using chemical vapor deposition (CVD) or physical vapor deposition (PVD) methods. For example, the metal liner 36 may be formed using atomic layer deposition (ALD). Examples of CVD suitable for forming the metal liner 36 include plasma enhanced CVD. Examples of PVD suitable for forming the metal liner 36 include plating or sputtering. The thickness of the metal liner 36 may range from 1 nm to 10 nm. In some examples, the thickness of the metal liner 36 may range from 1 nm to 5 nm.

Following formation of the metal liner 36, the via openings may be filled with the third contact portion 37 of the interconnect. The third contact portion 37 is typically composed of an electrically conductive material. For example, the third contact portion 37 may be composed of a metal that is selected from tungsten (W), cobalt (Co), ruthenium (Ru), titanium (Ti), aluminum (Al), copper (Cu) and combinations thereof. In other examples, the third contact portion 37 may be composed of a doped semiconductor, such as n-type polysilicon. The electrically conductive material for the third contact portion 37 may be deposited using chemical vapor deposition (CVD) or physical vapor deposition (PVD). Examples of CVD suitable for forming the first contact portion include metal organic chemical vapor deposition (MOCVD), plasma enhanced chemical vapor deposition (PECVD), and high density plasma (HDPCVD). Examples of PVD suitable for forming the third contact portion 37 of the interconnect including plating, electroplating, electroless plating, sputtering and combinations thereof. The upper surface of the third contact portion 37 may be planarized to be coplanar with the upper surface of the interlevel dielectric layer 31.

Referring to FIG. 5, in some embodiments, the above described method provides an electrical contact, i.e., interconnect, that includes a first contact portion 20 extending through an intralevel dielectric 14 to a semiconductor device; and a second contact portion 25 that has an exterior surface defined by a curvature and a width greater than the first contact portion 20. The curvature of the second contact portion 25 has a greater surface area than the planar upper surface of the first contact portion 20. The contact may further include a third contact portion 37 in direct contact with the second contact portion 25 that encapsulates the second contact portion 25. In the embodiment that is depicted in FIG. 5, the second contact portion 25 extends around to encapsulate a sidewall portion of the first contact portion 20 that extends above the intralevel dielectric 14. The curvature, width and encapsulation provided by the second contact portion 25 relative to the first contact portion enlarges the contact area between the first contact portion 20 and the third contact portion 37, which reduces the middle of the line (MOL) resistance.

In one example, an interconnect similar to the structure depicted in FIG. 5, but not including the second contact portion 20, would provide a total resistance on the order of 400Ω per interconnect or greater. In comparison, an interconnect including the second contact portion 25 in combination with the first contact portion 20 and third contact portion 37, as depicted in FIG. 5, can provide a total resistance 265Ω per interconnect or less.

Figure 6:
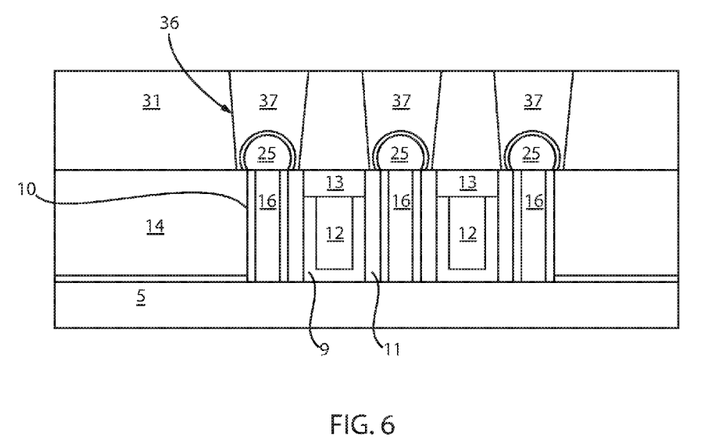
FIG. 6 is a side cross-sectional view depicting a contact having an increased surface area interface portion without requiring that an intralevel dielectric layer be etched before forming the portion having the increases surface area.

FIG. 6 depicts another embodiment a contact having an increased surface area interface portion. In the embodiment that is depicted in FIG. 6, the second contact portion 25 is only in direct contact with the upper surface of the first contact portion 20. The second contact portion 25 is not in contact with the sidewall of the first contact portion 20. The embodiment depicted in FIG. 6 is similar to the embodiments that are described with reference to FIGS. 1-5, with the exception that the embodiment that is described in FIG. 6 does not require that the intralevel dielectric layer 14 be etched before forming the second contact portion 25 having the increased surface area with respect to the first contact portion 20. In some embodiments, the electrical device depicted in FIG. 6 is formed using a method for that includes forming a contact stud, i.e., first contact portion 20, extending through an intralevel dielectric layer 14 to a component of the electrical device, e.g., fin structure 5, and selectively forming contact region, e.g., second contact portion 25, on an upper surface of the contact stud that is coplanar with an upper surface of the intralevel dielectric layer 14. Similar with the embodiments described in FIGS. 1-5, the selectively formed contact region, i.e., second contact portion 35, has an exterior surface defined by a curvature and has a surface area that is greater than a surface area of the contact stud, i.e., first contact portion 20. An interlevel dielectric layer 31 is formed on the intralevel dielectric layer 14, wherein an interlevel contact 37 extends through the interlevel dielectric layer 31 into direct contact with the selectively formed contact region, e.g., second contact portion 35.

In one example, an interconnect similar to the structure depicted in FIG. 6, but not including the second contact portion 20, would provide a total resistance on the order of 400Ω per interconnect or greater. In comparison, an interconnect including the second contact portion 25 in combination with the first contact portion 20 and third contact portion 37, as depicted in FIG. 6, can provide a total resistance 285Ω per interconnect or less.

Having described preferred embodiments of a structure and method for forming contacts having a geometry to reduce resistance, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of increasing the surface area of a contact to an electrical device comprising:

forming a contact stud extending through an intralevel dielectric layer to a component of the electrical device;

selectively forming a contact region of metal on an upper surface of the contact stud that is coplanar with an upper surface of the intralevel dielectric layer, wherein the selectively formed contact region has an exterior surface defined by a curvature and has a surface area that is greater than a surface area of the upper surface of the contact stud, the selective forming method including saturating the contact region with hydrogen and directly depositing the contact region of the metal of the contact region without depositing the metal on the intralevel dielectric; and forming an interlevel dielectric layer on the intralevel dielectric layer, wherein an interlevel contact extends through the interlevel dielectric layer into direct contact with the selectively formed contact region.

2. The method of claim 1, wherein the component of the electrical device comprises a field effect transistor, a metal oxide semiconductor field effect transistor, a fin field effect transistor, a memory device, a resistor, a capacitor or a combination thereof.

3. The method of claim 1, wherein said forming the contact stud comprises:

depositing the intralevel dielectric layer on the component of the electrical device;

forming a via opening through the intralevel dielectric to a contact portion of the component;

forming a metal liner on the sidewalls of the via opening; and filling the via opening with a conductive material for the first contact portion.

4. The method of claim 1, wherein said selectively forming the contact region on the upper surface of the contact stud that is coplanar with the upper surface of the intralevel dielectric layer comprises chemical vapor deposition or atomic layer deposition.

* * * * *